United States Patent
Shima

(10) Patent No.: US 7,154,581 B2
(45) Date of Patent: Dec. 26, 2006

(54) SCANNING EXPOSURE APPARATUS, MANUFACTURING METHOD THEREOF, AND DEVICE MANUFACTURING METHOD

(75) Inventor: Shinichi Shima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/327,178

(22) Filed: Dec. 24, 2002

(65) Prior Publication Data

US 2003/0133087 A1    Jul. 17, 2003

(30) Foreign Application Priority Data

Jan. 8, 2002   (JP) .............. 2002-001603

(51) Int. Cl.
G03B 27/42 (2006.01)
G03B 27/52 (2006.01)
G03B 27/32 (2006.01)
G03B 27/62 (2006.01)

(52) U.S. Cl. .............. 355/53; 355/55; 355/77; 355/75

(58) Field of Classification Search .......... 355/53, 355/52, 55, 75, 77; 430/30, 5; 250/545; 356/399, 400, 401
See application file for complete search history.

(56) References Cited

U.S. PATENT DOCUMENTS

| | | | |
|---|---|---|---|
| 5,117,255 A | 5/1992 | Shiraishi et al. ........... | 355/53 |
| 5,894,056 A | 4/1999 | Kakizaki et al. ........... | 430/5 |
| 5,971,577 A | 10/1999 | Mori et al. .............. | 362/575 |
| 6,040,096 A | 3/2000 | Kakizaki et al. ........... | 430/5 |
| 6,268,903 B1 | 7/2001 | Chiba et al. ............. | 355/53 |
| 6,280,062 B1 | 8/2001 | Mori et al. .............. | 362/308 |
| 6,377,333 B1 | 4/2002 | Chiba et al. ............. | 355/53 |
| 6,406,820 B1 * | 6/2002 | Ota .................... | 430/30 |
| 6,665,049 B1 * | 12/2003 | Takahashi ............... | 355/53 |
| 2002/0057424 A1 | 5/2002 | Shima .................. | 355/53 |
| 2003/0128344 A1 * | 7/2003 | Nishi ................... | 355/52 |

FOREIGN PATENT DOCUMENTS

| | | |
|---|---|---|
| EP | 1 024 522 | 8/2000 |
| EP | 1 158 361 A1 | 11/2001 |
| JP | 4-127514 | 4/1992 |
| JP | 4-134813 | 5/1992 |
| JP | 6-349702 | 12/1994 |
| JP | 8-203805 | 8/1996 |
| JP | 9-171246 | 6/1997 |
| JP | 11-31652 | 2/1999 |
| JP | 11-045842 | 2/1999 |
| JP | 2001-117213 | 4/2001 |
| WO | WO 99/05709 | 2/1999 |

OTHER PUBLICATIONS

Japanese Office Action dated Aug. 29, 2005, issued in corresponding Japanese patent application No. 2002-001603.

* cited by examiner

Primary Examiner—Peter B. Kim
(74) Attorney, Agent, or Firm—Fitzpatrick, Cella, Harper & Scinto

(57) ABSTRACT

A scanning exposure apparatus includes a master stage which holds a master and moves in a predetermined scanning direction, a projection optical system which projects a pattern of the master onto a substrate, and an optical element which is held by the master stage and moved together with the master. The optical element is so constituted as to optically correct a shift of the master held by the master stage from an ideal state.

12 Claims, 12 Drawing Sheets

SCANNING EXPOSURE APPARATUS, MANUFACTURING METHOD THEREOF, AND DEVICE MANUFACTURING METHOD

FIELD OF THE INVENTION

The present invention relates to a scanning exposure apparatus, a manufacturing method thereof, and a device manufacturing method.

BACKGROUND OF THE INVENTION

The manufacture of various devices such as a semiconductor device, a liquid crystal display device, and a thin-film magnetic head by photolithography uses a projection exposure apparatus which transfers the pattern of a master such as a photomask or reticle onto a substrate such as a photosensitive wafer or glass plate. Recently, semiconductor devices, and the like, are micropatterned more and more. To implement this, the resolution of the projection optical system must be increased. The resolution can be increased by shortening the wavelength of exposure light or increasing the numeral aperture of the projection optical system.

As for the chip pattern of one semiconductor device, the chip pattern becomes larger. This poses the need for an exposure apparatus capable of transferring a larger-area pattern. Such an exposure apparatus requires a high-resolution projection optical system for a large exposure region. However, as the exposure region becomes larger and the resolution becomes higher, it becomes more difficult to maintain the imaging performance such as distortion in the entire exposure region at a predetermined precision.

In this situation, the currently noteworthy exposure apparatus is a scanning exposure apparatus. The scanning exposure apparatus transfers a reticle pattern onto a wafer while sync-scanning the reticle and wafer relative to a rectangular, an arcuate, or a slit-like illumination region.

The scanning exposure apparatus uses only part of the projection optical system by illuminating a reticle with slit light. The scanning exposure apparatus can therefore easily maintain the imaging performance such as distortion at a predetermined precision. The scanning exposure apparatus can advantageously utilize the maximum diameter of the effective exposure region of the projection optical system by illuminating a reticle with slit light, and widen the exposure region without any restriction of the optical system in the scanning direction.

At present, however, demands have arisen for further micropatterning, and the scanning exposure apparatus must reduce aberrations such as pattern image distortion.

A projection optical system mounted in a conventional stepper is so optically designed as to reduce aberrations and distortion on average in the entire projection field of view. Lens elements and optical members are processed at a high precision such that aberrations including distortion fall with the design tolerance. Aberrations are actually measured, and the air gap between lenses, lens tilt, parallel decentering, and the like, are adjusted. These operations are complicated, and require cumbersome assembly, adjustment, and inspection, and are repeated to assemble a projection optical system.

As for distortion out of aberrations, a component symmetrical to the optical axis or a regular asymmetric component can be adjusted by the above-mentioned adjustment method.

A so-called random component cannot be adjusted by the above-mentioned adjustment method.

To solve this problem, for example, Japanese Patent Laid-Open No. 8-203805 discloses a method in which the image distortion characteristic of an assembled projection optical system is actually measured and an optical corrector plate so polished as to partially deflect a principal ray passing through each point within the projection field of view is inserted into a projection optical path so as to minimize the measured image distortion characteristic at each point within the projection field of view in order to make it easier to manufacture such a high-precision projection optical system and to reduce even a random component to the design tolerance.

The method disclosed in Japanese Patent Laid-Open No. 8-203805 is a correction method for a stepper using an optical corrector plate, and cannot be directly applied to the scanning exposure apparatus.

In regard to this, Japanese Patent Laid-Open No. 11-045842 discloses a scanning exposure apparatus which adopts a correction method using an optical corrector plate. In Japanese Patent Laid-Open No. 11-045842, attention is given to the fact that a static image distortion characteristic along the width within the projection region is averaged into a dynamic image distortion characteristic in the scanning direction when the scanning projection exposure apparatus scans a mask pattern and transfers it onto a photosensitive substrate. As for at least the random component of the dynamic image distortion characteristic, aberration is corrected by inserting, into the projection optical path, an image distortion corrector plate prepared by locally polishing and processing the surface of a transparent parallel plate (optical corrector plate).

The manufacture and measurement of the optical corrector plate receive attention in Japanese Patent Laid-Open No. 11-031652. In Japanese Patent Laid-Open No. 11-031652, the optical corrector plate is formed from a substrate with a wedge angle in order to prevent interference of light on the lower surface of the optical corrector plate when the surface shape of the optical corrector plate is measured using an interferometer.

Japanese Patent Laid-Open No. 6-349702 discloses a method of adjusting the aberration characteristic of a projection optical system by rotating, about the optical axis, some of lens elements which constitute the projection optical system in order to improve the image distortion characteristic of a resist image on a photosensitive substrate on which a pattern is transferred by scanning exposure. In addition, as disclosed in Japanese Patent Laid-Open Nos. 4-127514 and 4-134813, the projection magnification, distortion, and the like, are adjusted by finely moving some of the lens elements which constitute a projection optical system.

When the aberration characteristic is adjusted by rotating some of the lens elements of the projection optical system, or decentering or tilting the optical axis, as in the prior art, a good aberration characteristic (distortion characteristic) is not necessarily obtained. In this adjustment method, it is difficult to ensure stable precision, and adjustment work is by trial-and-error and is cumbersome. The most serious problem of this method is that it is difficult to partially adjust and correct only a local image distortion characteristic within the effective projection region though the overall image distortion characteristic of the projection optical system within the effective projection region can be uniformly adjusted and corrected to a desired trend.

As for the stepper, the local image distortion characteristic within the effective projection region will be easily improved by fabricating an optical corrector plate as disclosed in Japanese Patent Laid-Open No. 8-203805 and inserting it into the projection optical path.

As for the scanning exposure apparatus, the local image distortion characteristic within the effective projection region will be easily improved by fabricating an optical corrector plate by a method as disclosed in Japanese Patent Laid-Open No. 11-045842 and inserting it into the projection optical path.

According to the conventional method disclosed in Japanese Patent Laid-Open No. 11-045842, the image distortion characteristic is measured in the exposure apparatus. The optical corrector plate is dismounted from the exposure apparatus, polished and processed based on the image distortion characteristic measurement result, and then attached to the exposure apparatus again. After that, the image distortion characteristic is confirmed, which requires a very long work time.

One of known factors which causes distortion is reticle deformation. In the above-described correction using the optical corrector plate, the image distortion characteristic of the assembled projection optical system is actually measured, and the optical corrector plate is so polished as to partially deflect a principal ray passing through each point within the projection field of view so as to minimize the measured image distortion characteristic at each point within the projection field of view. If the reticle deforms, the pattern formed on the reticle misaligns. The method of polishing an optical corrector plate on the basis of the measured image distortion characteristic of the projection optical system cannot cope with reticle deformation. As a result, the reticle pattern projected onto the image plane via the projection optical system deforms.

According to the methods disclosed in Japanese Patent Laid-Open Nos. 8-203805 and 11-045842, the image distortion characteristic including reticle deformation is measured and corrected. For example, when the reticle stage is replaced, the image distortion characteristic must be measured again.

The optical corrector element disclosed in Japanese Patent Laid-Open No. 11-045842 is arranged apart from the movable portion of the reticle stage in order to allow the reticle stage to hold a reticle and move in the scanning direction. That is, Japanese Patent Laid-Open No. 11-045842 does not disclose the concept that the optical corrector element is arranged near the reticle. As will be described later, the present inventor gives attention to the fact that it is advantageous to arrange the optical corrector element close to the reticle as much as possible in order to correct distortion.

The optical corrector element disclosed in Japanese Patent Laid-Open No. 11-045842 is arranged in a space obtained by shaving part of the base of the reticle stage. Shaving the base of the reticle stage decreases the base rigidity, decreasing the reticle stage driving precision.

SUMMARY OF THE INVENTION

The present invention has been made in consideration of the above situation, and has as its object to correct, at a high precision, the defect (e.g., distortion) of a pattern projected onto a substrate that is caused by, e.g., the surface shape of a master on a master stage, and/or to facilitate correction.

The first aspect of the present invention is directed to a scanning exposure apparatus comprising a master stage which holds a master and moves in a predetermined scanning direction, a projection optical system which projects a pattern of the master onto a substrate, and an optical element which is held by the master stage and moved together with the master.

According to a preferred aspect of the present invention, the optical element is preferably so constituted as to optically correct a shift of the master held by the master stage from an ideal state, e.g., a shift of a surface shape of the master held by the master stage from an ideal plane. The shift of the surface shape of the master held by the master stage from the ideal plane includes, e.g., a shift of the surface shape of the master itself from the ideal plane, a shift, from the ideal plane, of the master held by the master stage that is caused by deformation by a weight of the master, and a shift, from the ideal plane, of the surface shape of the master caused by a shape of a holding portion of the master stage for holding the master.

According to another preferred aspect of the present invention, the optical element mounted in the scanning exposure apparatus is preferably so processed as to form a desired image on the substrate based on a measurement result of, while holding an exposure or a measurement master by the master stage, measuring a surface shape of the master.

According to still another preferred aspect of the present invention, the scanning exposure apparatus preferably further comprises a second optical element for correcting aberration of the projection optical system.

According to still another preferred aspect of the present invention, it is preferable that the optical system be so processed as to correct distortion of the pattern of the master projected onto the substrate that is caused by the master held by the master stage, and the scanning exposure apparatus further comprise a second optical element so processed as to correct a shift of the pattern of the master projected onto the substrate that is caused by aberration of the projection optical system, e.g., misalignment caused by distortion.

The second aspect of the present invention is directed to a scanning exposure apparatus manufacturing method. The scanning exposure apparatus to be manufactured has a master stage which holds a master and moves in a predetermined scanning direction, a projection optical system which projects a pattern of the master onto a substrate, and an optical element which is held by the master stage and moved together with the master. The manufacturing method of manufacturing the scanning exposure apparatus comprises the steps of causing the master stage to hold the master or a measurement reference master, measuring a surface shape of the master or the reference master held by the master stage, processing the optical element on the basis of a result of the measurement, and assembling the processed optical element into the master stage.

According to still another aspect of the present invention, the method preferably further comprises the step of assembling the master stage into the scanning exposure apparatus after assembling the processed optical element into the master stage.

The third aspect of the present invention is directed to a scanning exposure apparatus manufacturing method. The scanning exposure apparatus to be manufactured has a master stage which holds a master and moves in a predetermined scanning direction, a projection optical system which projects a pattern of the master onto a substrate, a first optical element which is held by the master stage and moved together with the master, and a second optical element for correcting aberration of the projection optical system. The manufacturing method of manufacturing the scanning exposure apparatus comprises the master stage assembly step of processing the first optical element so as to optically correct a shift of the master held by the master stage from an ideal state, then assembling the first optical element into the master stage, and assembling the master stage into the scanning exposure apparatus, and the projection optical system assembly step of processing the second optical element so as to correct aberration of the projection optical system, and then assembling the projection optical system into the scanning exposure apparatus together with the second optical element.

According to still another aspect of the present invention, processing of the first optical element and processing of the second optical element are preferably performed in parallel with each other.

The fourth aspect of the present invention is directed to a device manufacturing method comprising the steps of applying a photosensitive agent to a substrate, transferring a pattern onto the substrate coated with the photosensitive agent by using the scanning exposure apparatus, and developing the photosensitive agent of the substrate to which the pattern is transferred. Distortion of the pattern transferred onto the substrate that is caused by a surface shape of the master is preferably suppressed by a first optical element.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

[First Embodiment]

Figure 1:
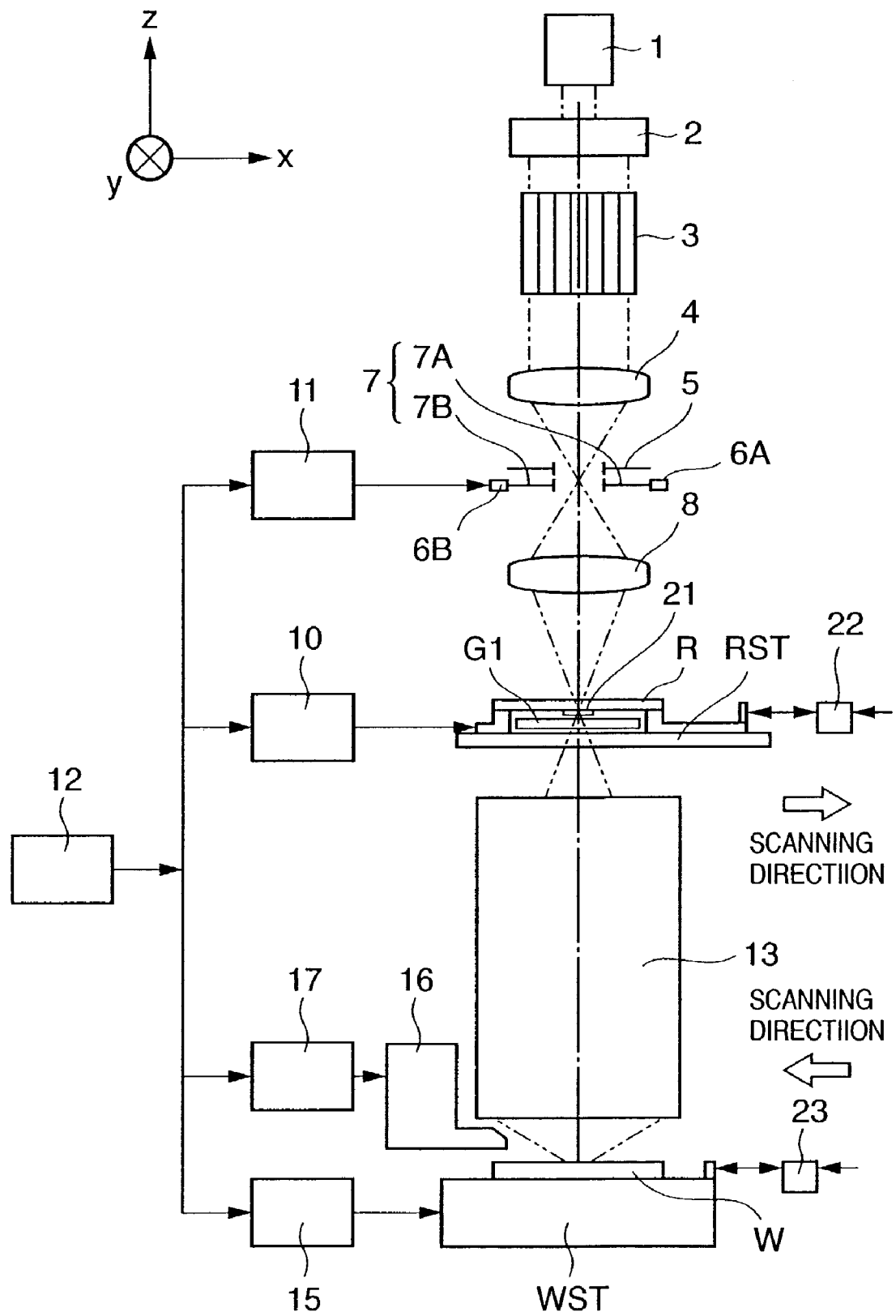
FIG. 1 is a view showing the schematic arrangement of a scanning exposure apparatus according to the first preferred embodiment of the present invention.

FIG. 1 is a view showing the schematic arrangement of a scanning exposure apparatus according to a preferred embodiment of the present invention. In this scanning exposure apparatus (scanner), light emitted by a light source 1 illuminates a rectangular slit-like illumination region 21 out of an entire reticle R at a uniform illuminance via an illumination optical system constituted by an illumination light shaping optical system 2 to relay lens 8. The circuit pattern image of the reticle R within the slit-like illumination region 21 is transferred onto a wafer W via a projection optical system 13. The light source 1 can be any one of various light sources including an excimer laser source such as an $F_2$ excimer laser, an ArF excimer laser, or a KrF excimer laser, a metal vapor laser source, a pulse light source such as a YAG laser harmonic generator, and a continuous light source such as a combination of a mercury lamp and a reflecting mirror.

When the pulse light source is adopted, ON/OFF operation of exposure is typically switched by controlling power supplied from a pulse light source power supply. When the continuous light source is adopted, ON/OFF operation of exposure is typically switched by a shutter in the illumination light shaping optical system 2. Since the first embodiment uses a movable blind (variable field stop) 7 which will be described later, ON/OFF operation of exposure may be switched by opening/closing the movable blind 7.

Illumination light emitted by the light source 1 is set to a predetermined beam diameter by the illumination light shaping optical system 2 and then reaches a fly-eye lens 3. The exit surface of the fly-eye lens 3 has many secondary light sources. Illumination beams from these secondary light sources are condensed by a condenser lens 4, and reach the movable blind (variable field stop) 7 (7A and 7B) via a fixed field stop 5. In FIG. 1, the fixed field stop 5 is arranged on the condenser lens 4 side from the movable blind 7, but may be arranged on the relay lens system 8 side.

The fixed field stop 5 has a rectangular slit-like opening. A beam having passed through the fixed field stop 5 is shaped into a beam having a rectangular slit-like section, and enters the relay lens system 8. The longitudinal direction of the slit is a direction (Y direction) perpendicular to the sheet surface of FIG. 1. The relay lens system 8 is a lens system which makes the movable blind 7 and the pattern formation surface of the reticle R conjugate to each other. The movable blind 7 is constituted by two blades (light-shielding plates) 7A and 7B which define the width in the scanning direction (X direction), and two blades (not shown) which define the width in a non-scanning direction (Y direction) perpendicular to the scanning direction. The blades 7A and 7B which define the width in the scanning direction are respectively supported by driving units 6A and 6B so as to independently move in the scanning direction. Also, the two blades (not shown) which define the width in the non-scanning direction are so supported as to be independently driven. In the first embodiment, illumination light irradiates only a desired exposure region set by the movable blind 7 within the slit-like illumination region 21 on the reticle R that is set by the fixed field stop 5. The relay lens system 8 is a both-side telecentric optical system, and the telecentricity is maintained in the slit-like illumination region 21 on the reticle R.

The reticle R is held by a reticle stage RST. The position of the reticle stage RST is detected by an interferometer 22, and the reticle stage RST is driven by a reticle stage driving unit 10. A correction optical element G1 is held below the reticle R, and scanned together with the reticle R in scanning and driving the reticle stage RST. A circuit pattern image on the reticle R that is defined by the movable blind 7 within the slit-like illumination region 21 is projected onto the wafer W via the projection optical system 13.

Assume that the scanning direction of the reticle R with respect to the slit-like illumination region 21 within a two-dimensional plane perpendicular to the optical axis of the projection optical system 13 is the +X direction (or −X direction), and a direction parallel to the optical axis of the projection optical system 13 is the Z direction.

In this case, the reticle stage RST is driven by the reticle stage driving unit 10 and scans the reticle R in the scanning direction (+X or −X direction). The operations of the driving units 6A and 6B for the movable blind 7 and the driving units in the non-scanning direction are controlled by a movable blind controller 11. The operations of the reticle stage driving unit 10 and movable blind controller 11 are controlled by a main control system 12 which controls the operation of the whole apparatus.

The wafer W is transferred to a wafer stage WST by a wafer transfer device (not shown), and held on the wafer stage WST. The wafer stage WST is made up of an X-Y stage which aligns the wafer W within a plane perpendicular to the optical axis of the projection optical system 13 and scans the wafer W in the ±X direction, and a Z stage which aligns the wafer W in the Z direction. The position of the wafer stage WST is detected by an interferometer 23. An off-axis alignment sensor 16 is arranged above the wafer W. The alignment sensor 16 detects an alignment mark on the wafer, and the resultant data is processed by a controller 17 and sent to the main control system 12. The main control system 12 controls alignment operation and scanning operation of the wafer stage WST via a wafer stage driving unit 15.

When a pattern image on the reticle R is to be transferred onto each shot region on the wafer W via the projection optical system 13 by scan exposure, the reticle R is scanned at a velocity VR in the −X direction (or +X direction) with respect to the slit-like illumination region 21 set by the fixed field stop 5. The wafer W is scanned at a projection magnification $\beta$ of the projection optical system 13 and a velocity VW ($=\beta \cdot$VR) in the +X direction (or −X direction) in synchronism with scanning of the reticle R. In this manner, the circuit pattern image of the reticle R is continuously transferred onto shot regions on the wafer W.

Figure 2:
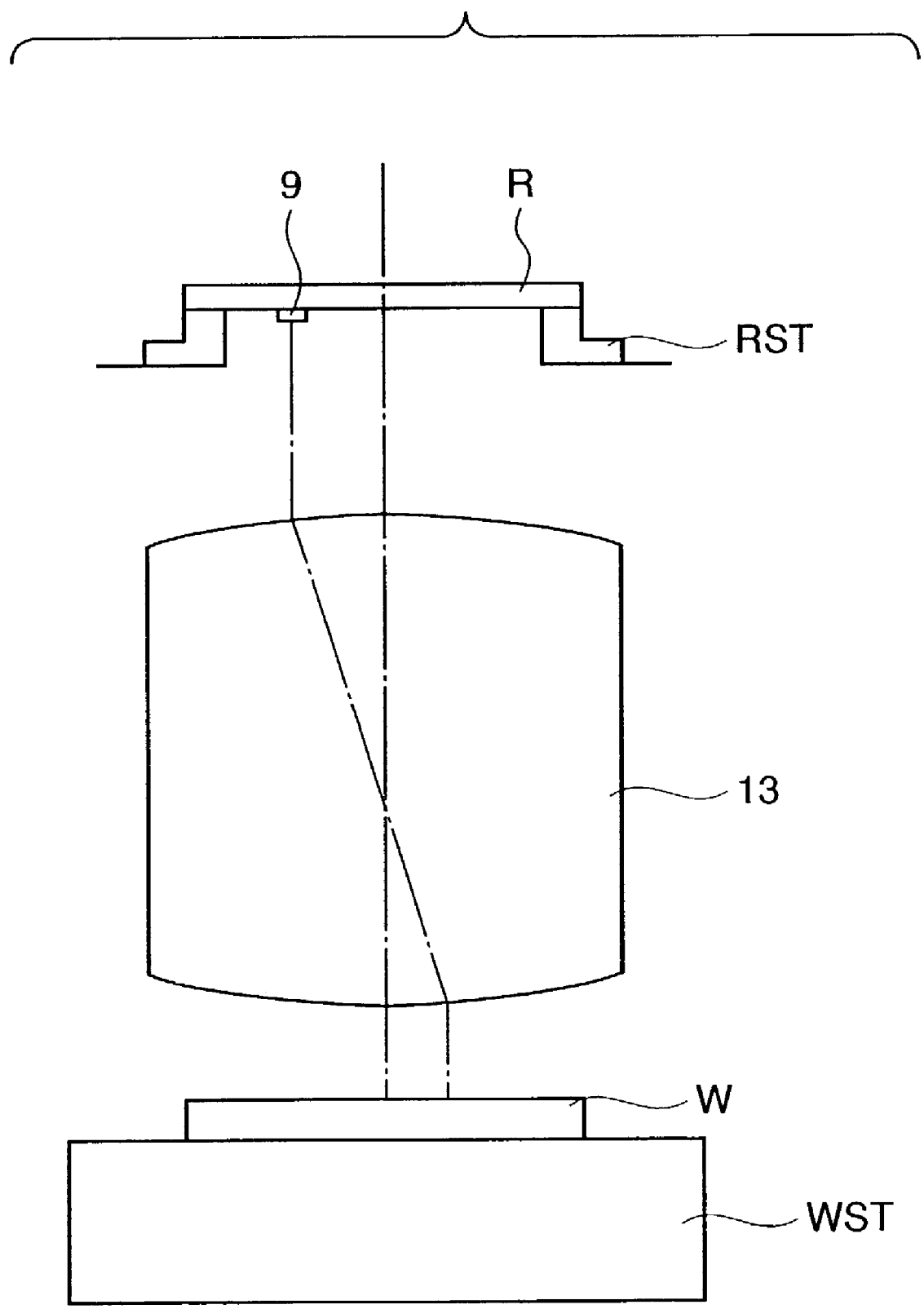
FIG. 2 is a schematic view showing a reticle R, projection optical system 13, and wafer W in the scanning exposure apparatus of FIG. 1.

The relationship between the surface shape of the pattern surface of the reticle R and the lateral shift amount at each portion of a projected image will be explained. FIG. 2 is a schematic view showing the reticle R, projection optical system 13, and wafer W in the scanning exposure apparatus of FIG. 1. In FIG. 2, the image of a pattern 9 on the reticle R held by the reticle stage RST is projected onto the wafer W via the projection optical system 13. Assuming that the reticle R is free from any deformation and the projection optical system 13 is also free from any distortion, the image of the pattern 9 is projected to an ideal position on the wafer W.

Figure 3:
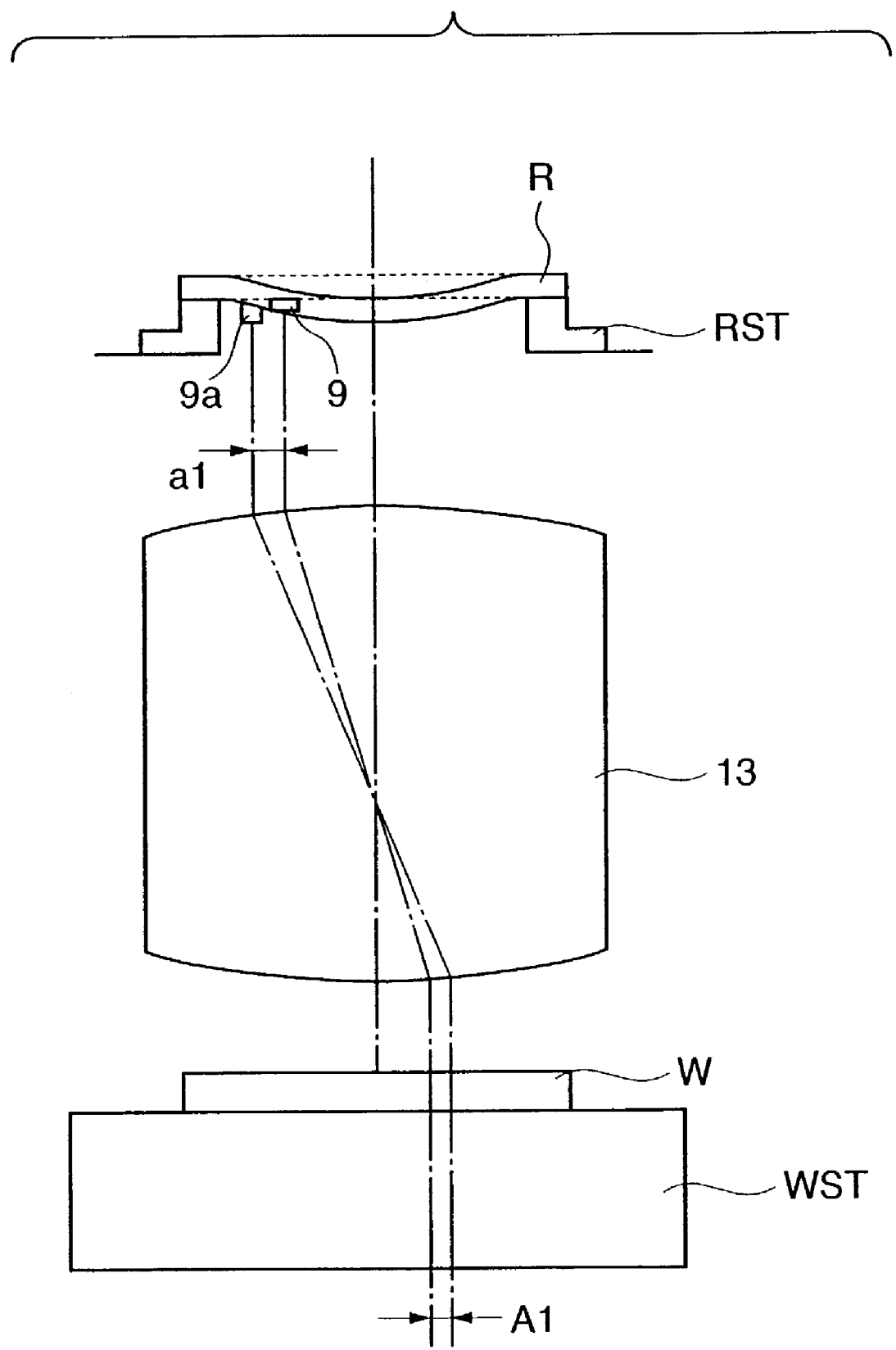
FIG. 3 is a view for explaining distortion of a projected image caused by deformation by the weight of the reticle.

The reticle R is chucked and held at two ends on the reticle stage RST. As shown in FIG. 3, the reticle R deflects downward from an ideal plane at the center owing to deformation by the weight of the reticle R. In FIG. 3, a pattern 9a of the reticle R deflected by its own weight laterally shifts by a1 from the ideal position of the pattern 9 in a direction in which the pattern 9 moves apart from the optical axis of the projection optical system 13.

Letting $\beta$ be the projection magnification (reduction magnification) of the projection optical system 13, a projected-image lateral shift amount $A1=\beta \cdot a1$ is generated on the wafer W. In other words, deformation by the weight of the reticle R generates a distortion A1.

Figure 4:
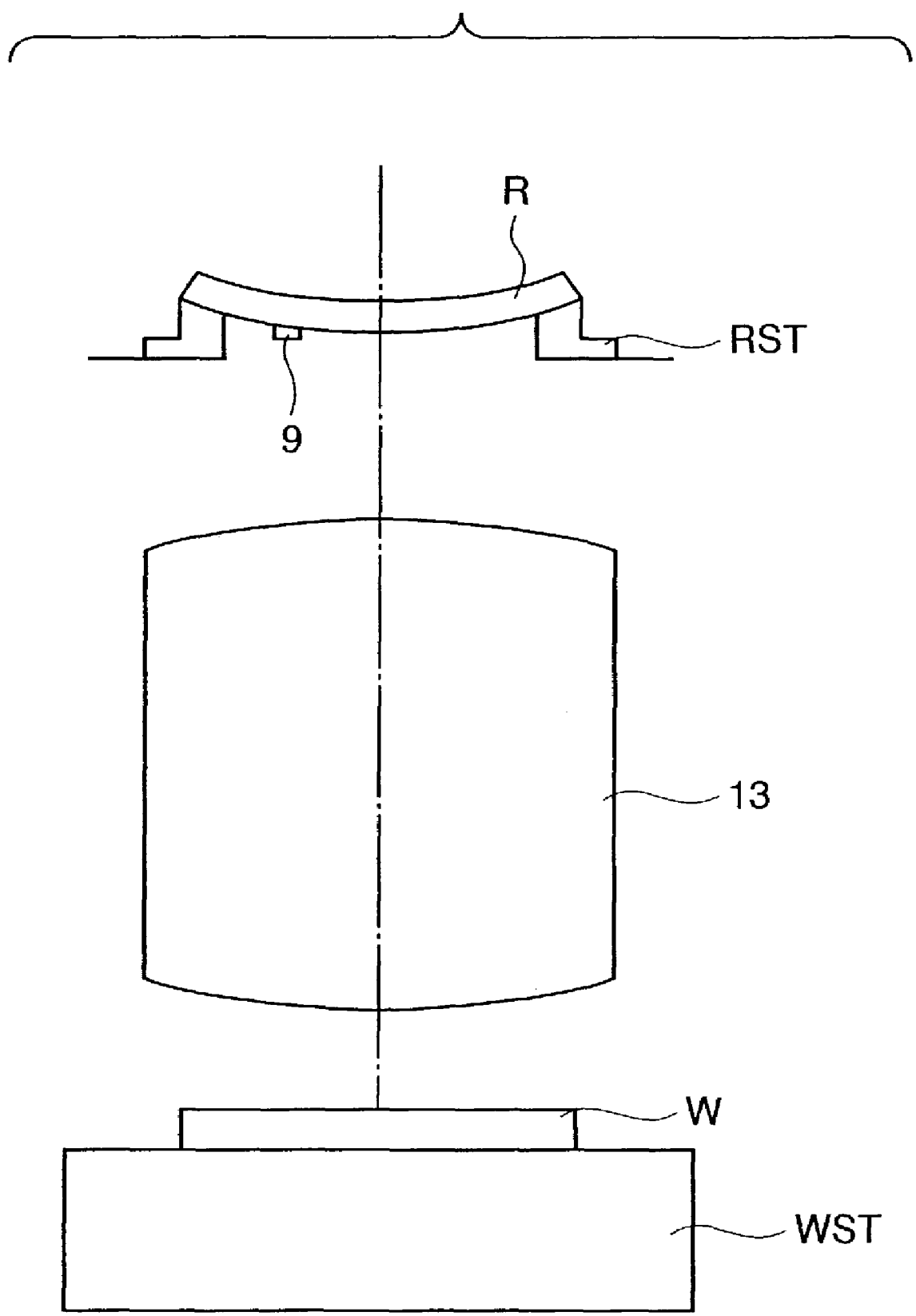
FIG. 4 is a view for explaining distortion of a projected image caused by inclination of the chucking portion of a reticle stage.

The reticle R deforms due to another factor in addition to deformation by the weight of the reticle R. FIG. 4 shows a case wherein the chucking portion (holding portion) of the reticle stage RST is so inclined as to fall toward the inside. If the reticle R is chucked in this state, the pattern surface of the reticle R deflects greater than the deflection amount by weight deformation. The deflection amount at this time is roughly calculated by adding a deflection amount generated by deformation caused by the weight of the reticle R to an amount obtained by multiplying the inclination angle of the chucking portion by the distance to the center of the reticle R. Due to this deflection amount, the pattern of the reticle R similarly misaligns from the ideal plane, generating distortion in a projected image.

In FIG. 4, the chucking portion of the reticle stage RST is so inclined as to fall toward the optical axis (inside) of the projection optical system 13. When the chucking portion is inclined in an opposite direction (outside), the reticle R deforms in a projecting direction. If a plurality of chucking portions of the reticle stage RST are arranged and even one surface shape is inclined from an ideal plane, the reticle R deforms to generate distortion.

Figure 5:
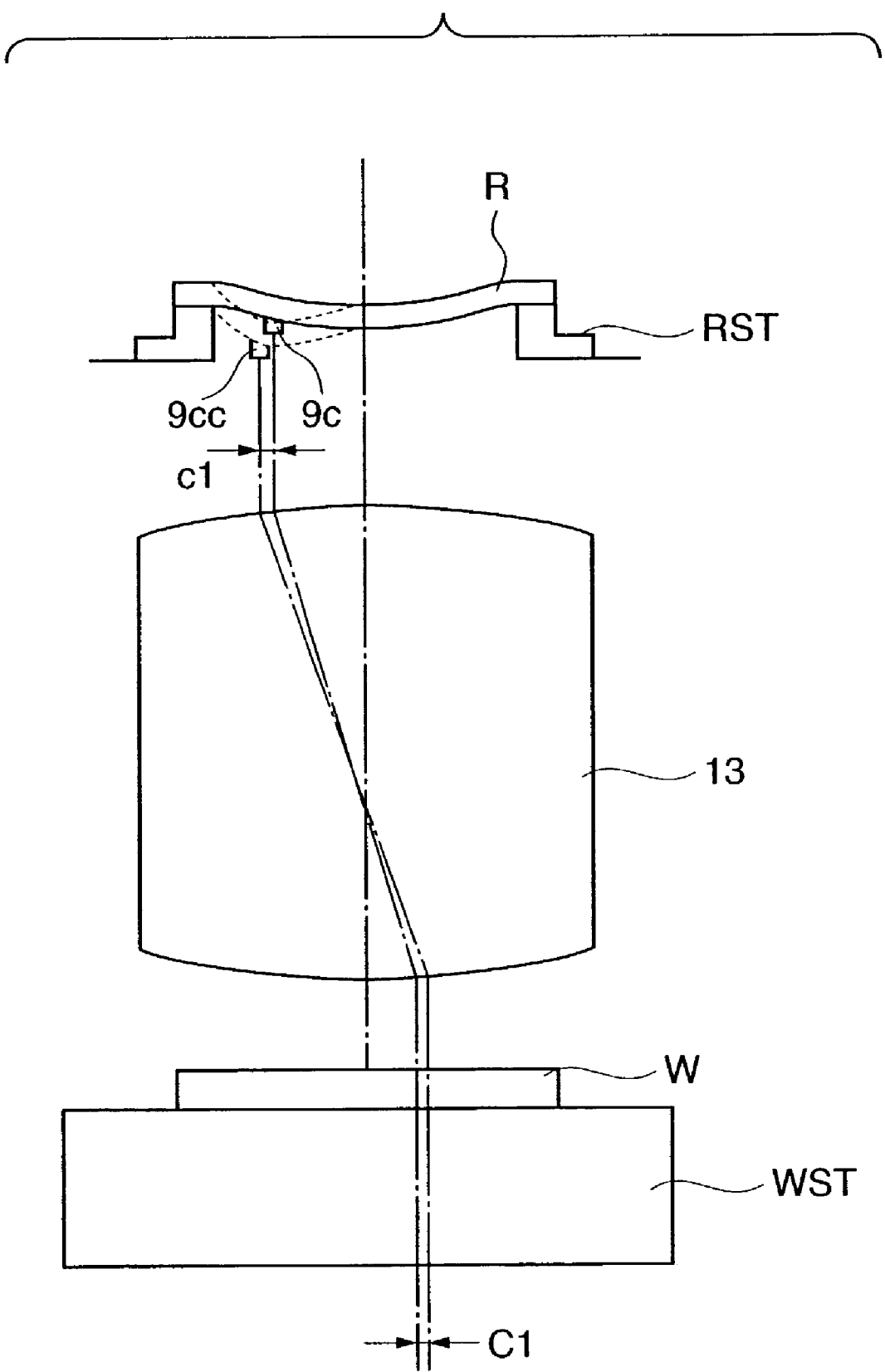
FIG. 5 is a view for explaining distortion of a projected image caused by the surface shape of the reticle.

Another factor is the surface shape of the reticle R itself. The pattern surface of the reticle R is actually corrugated. The influence of the surface shape of the pattern surface of the reticle R will be explained with reference to FIG. 5. When the reticle R is chucked and held by the reticle stage RST and only deformation by the weight of the reticle R occurs, the pattern 9 shifts to the position of a pattern 9c. When a given flatness error, i.e., corrugations exist on the pattern surface of the reticle R, the pattern 9c shifts to the position of a pattern 9cc. Hence, the pattern position laterally shifts by c1 from the ideal position of the pattern 9 in a direction in which the pattern 9 moves apart from the optical axis of the projection optical system 13.

Letting $\beta$ be the projection magnification (reduction magnification) of the projection optical system 13, a projected-image lateral shift amount $C1=\beta \cdot c1$ is generated on the wafer W. That is, a distortion C1, which is the sum of distortion by deformation caused by the weight of the reticle R and the flatness error of the pattern surface of the reticle R, occurs.

Of distortions generated by the pattern surface shape of the reticle R, distortion generated by deformation by the weight of the reticle R cannot be completely corrected by only the fixed optical element G1, because a plurality of reticles R are used, and they vary in thickness. However, variations in distortion amount by variations in deformation by the weights of a plurality of reticles R are smaller than the distortion amount in the use of an optical element G1 fabricated on the assumption that no weight deformation occurs. From this, distortion correction using an optical element G1 fabricated in consideration of weight deformation is effective.

As for the distortion generated by the flatness error of the chucking portion of the reticle stage RST, variations in flatness error between reticle stages RST lead to variations in distortion amount between exposure apparatus. It is, therefore, effective to correct the flatness error of the chucking portion of the reticle stage RST using the optical element G1.

Distortion generated by the flatness error of the pattern surface of the reticle R cannot be completely corrected by only the optical element G1 because a plurality of reticles R are used and vary in distortion amount in the presence of variations in flatness. If, however, a reticle for use is restricted, a correction optical element G1 can be fabricated for this reticle and can correct the above-described three distortions.

Figure 6:
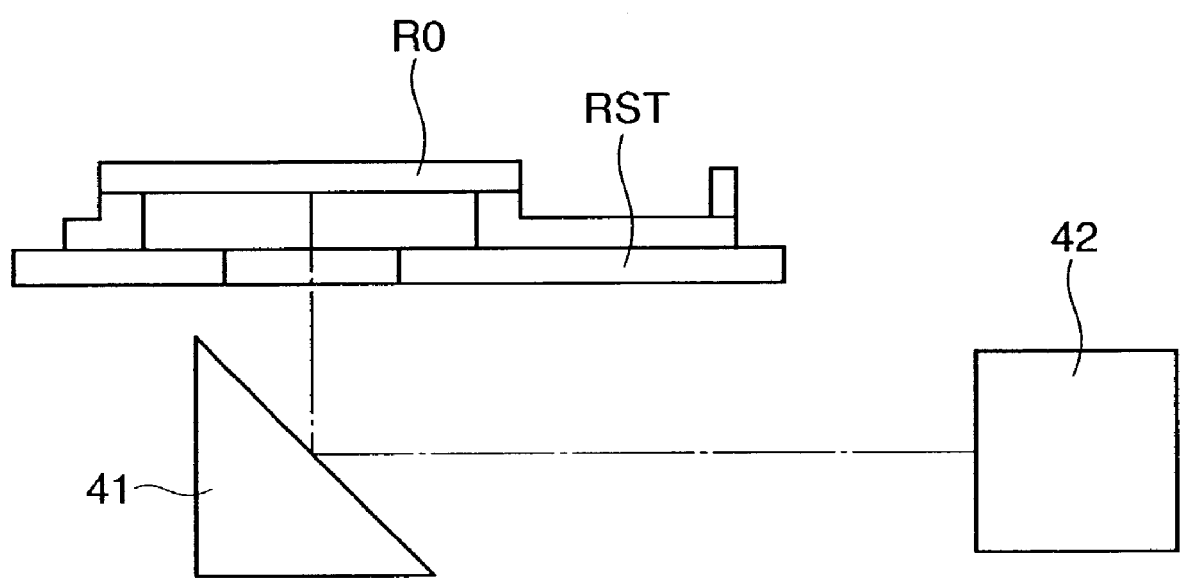
FIG. 6 is an explanatory view showing the principle of measuring the surface shape of the pattern surface of the reticle.

Measurement of the surface shape of the pattern surface of the reticle R will be explained with reference to FIG. 6. A measurement reference reticle R0 is chucked and held by the reticle stage RST, a reflecting mirror 41 is arranged below the reticle stage RST, and the surface shape of the pattern surface of the reference reticle R0 is measured by an interferometer 42. The reference reticle R0 is a reticle which is processed into a reference thickness and flatness in advance and measured for the thickness and the flatnesses of the pattern surface and portion to be chucked.

In the manufacture of a reticle, predetermined allowances are defined for the thickness and flatness error by SEMI standards or like. The reference reticle R0 is desirably a reticle close to the nominal dimension within the range of the allowance.

The surface shape of the optical element G1 is so polished and processed as to correct misalignment of the pattern caused by deformation of the reticle R held by the reticle stage RST on the basis of the measurement result of the surface shape of the reference reticle R0. The pattern surface side of the reference reticle R0 shown in FIG. 6 is formed into a reflecting surface to be measured by the interferometer. Although FIG. 6 illustrates a method using the interferometer, measurement is not limited to the interferometer and may be measurement using an oblique incidence optical system or the like, or measurement using an electrostatic capacitance sensor or the like.

Instead of the measurement-dedicated reference reticle R0, a general exposure (i.e., device manufacturing) reticle can also be used. In this case, the exposure reticle must have a plane precision within the tolerance.

Figure 7:
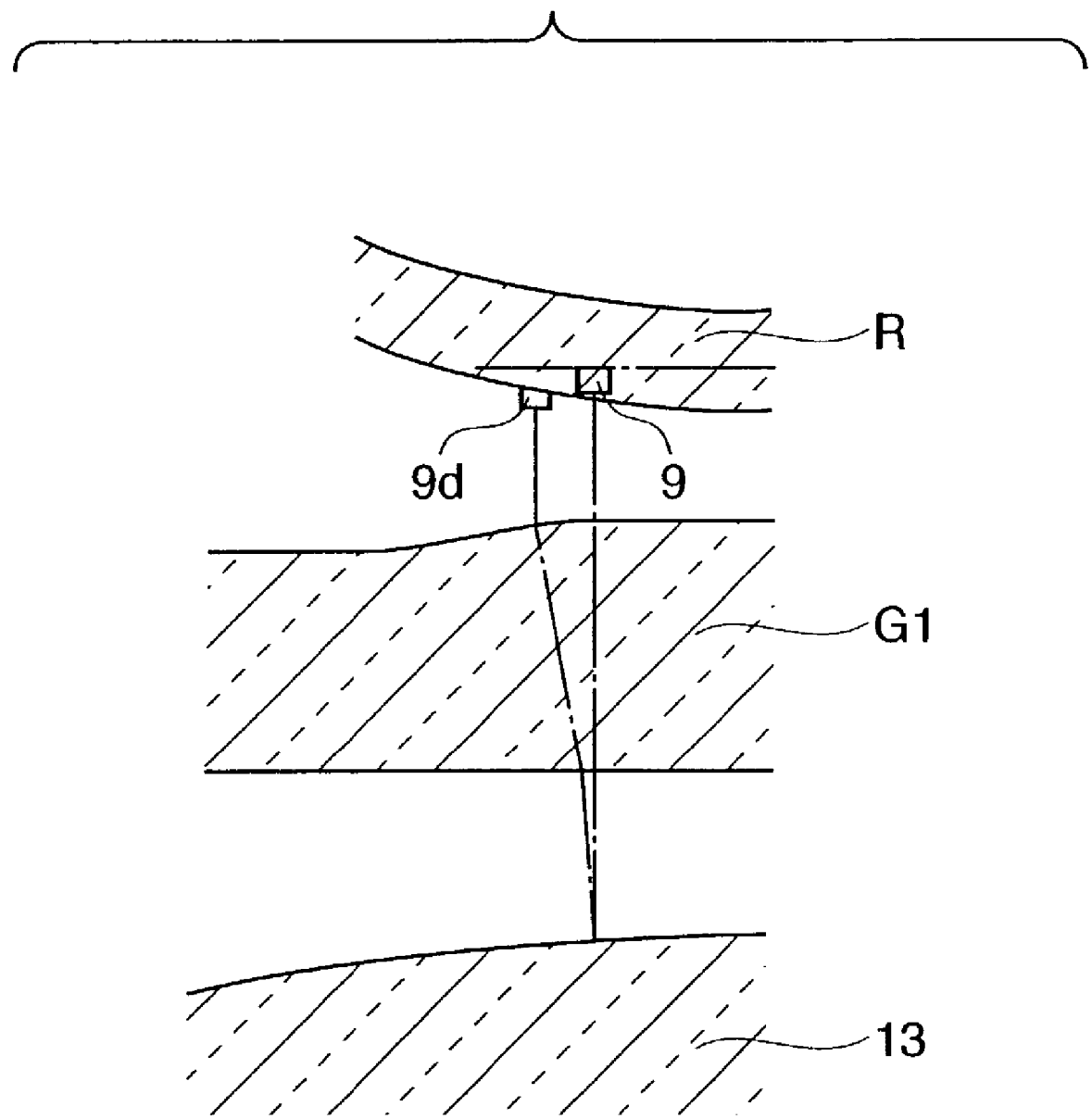
FIG. 7 is an enlarged schematic view showing an optical element G1, the pattern portion of the reticle R, and a lens closest to the reticle R among lenses which constitute the projection optical system 13.

FIG. 7 is an enlarged schematic view showing the optical element G1, the pattern portion of the reticle R, and a lens closest to the reticle R among lenses which constitute the projection optical system 13. The pattern 9 free from any deformation of the reticle R shifts to the position of a pattern 9*d* due to deformation of the reticle R. To correct this, the surface shape of the reticle R (or reference reticle R0) is measured. The surface shape of the optical element G1 is slightly processed on the basis of the measurement result so as to correct the shift from the position of the pattern 9 to the position of the pattern 9*d*.

The polishing/processing amount of the optical element G1 may be obtained from the calculation result of calculating the misalignment amount of the pattern from the surface shape of the pattern surface of the reticle R.

Alternatively, the polishing/processing amount of the optical element G1 may be obtained by the following method. While the reticle R is chucked and held by the reticle stage RST in advance, the surface shape of the pattern surface of the reticle R is measured. After that, the reticle stage RST is mounted in the exposure apparatus, the wafer W is exposed to a pattern, and a generated distortion amount is measured. In addition, the correlation between the surface shape of the pattern surface and the distortion amount is attained in advance. The surface shape of the pattern surface of the reticle R in the use of the reticle stage RST is obtained based on the measured distortion amount and the correlation. The polishing/processing amount of the optical element G1 can be calculated on the basis of the surface shape.

Alternatively, the polishing/processing amount of the optical element G1 may be obtained by the following method. A test apparatus, having a projection optical system, an illumination optical system, and a wafer stage in which aberrations including distortion are adjusted to a predetermined amount, is prepared. The reticle stage RST which holds the reticle R or reference reticle R0 is mounted in the test apparatus. A wafer is exposed to the pattern of the reticle R (R0) in the test apparatus, and the distortion amount is measured from the exposure result. The optical element G1 is polished and processed based on the distortion amount so as to correct distortion. This method can also correct distortion caused by the reticle stage RST and/or reticle R in parallel with the manufacture of the exposure apparatus main body, increasing the manufacturing work efficiency. The illumination region 21 to which the pattern of the reticle R is to be transferred has a slit shape elongated in a direction (Y direction) perpendicular to the scanning direction (X direction). The distortion amount generated in the widthwise direction is smaller by an amount corresponding to the aspect ratio than the distortion amount generated in the longitudinal direction of the slit. Further, the distortion amount is averaged in the scanning direction by scanning exposure. Exposure operation using the test apparatus may be executed by stationary exposure in order to correct distortion generated in the longitudinal direction of the slit.

Figure 8:
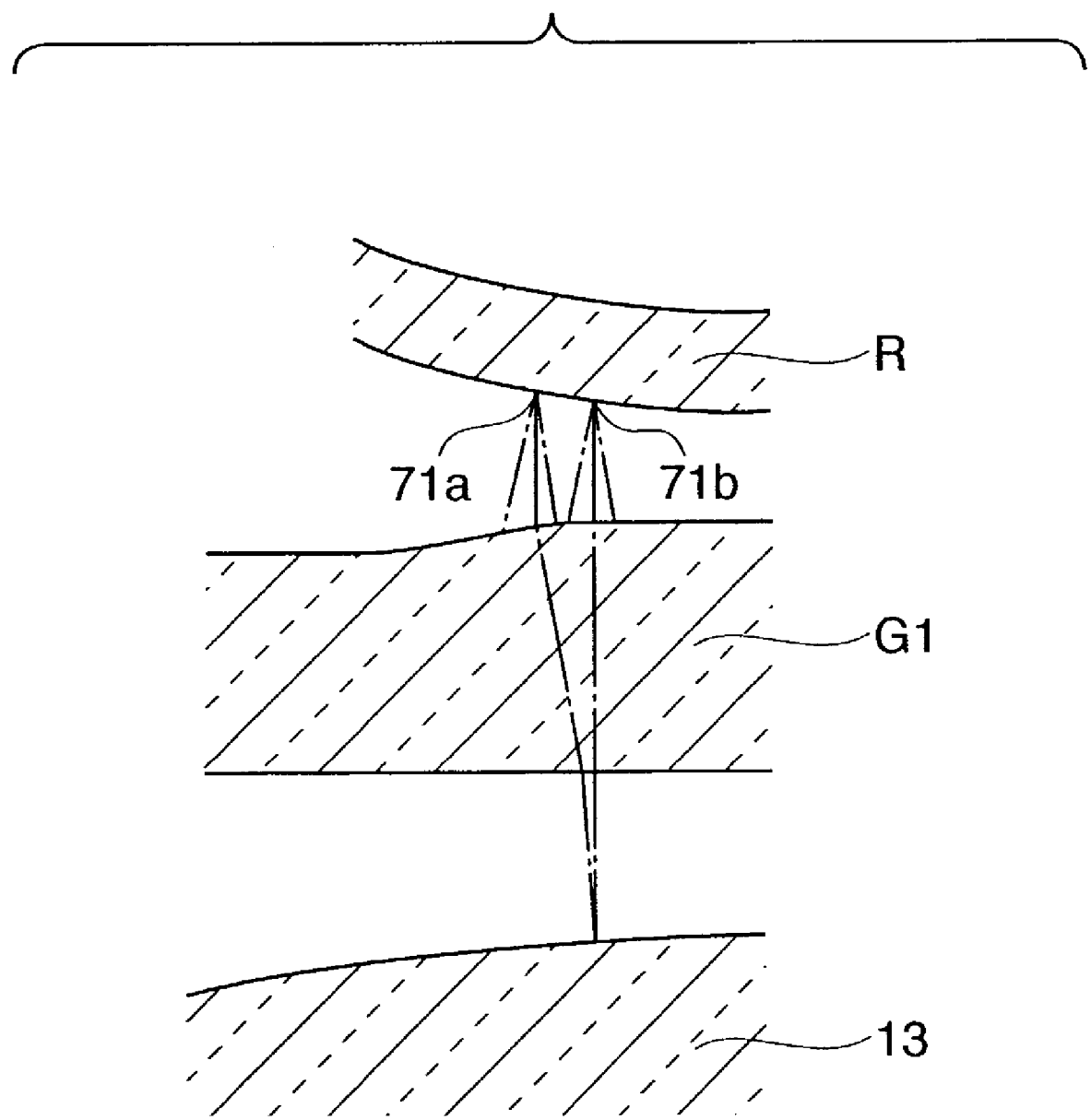
FIG. 8 is a view showing a preferred location of the optical element.
Figure 9:
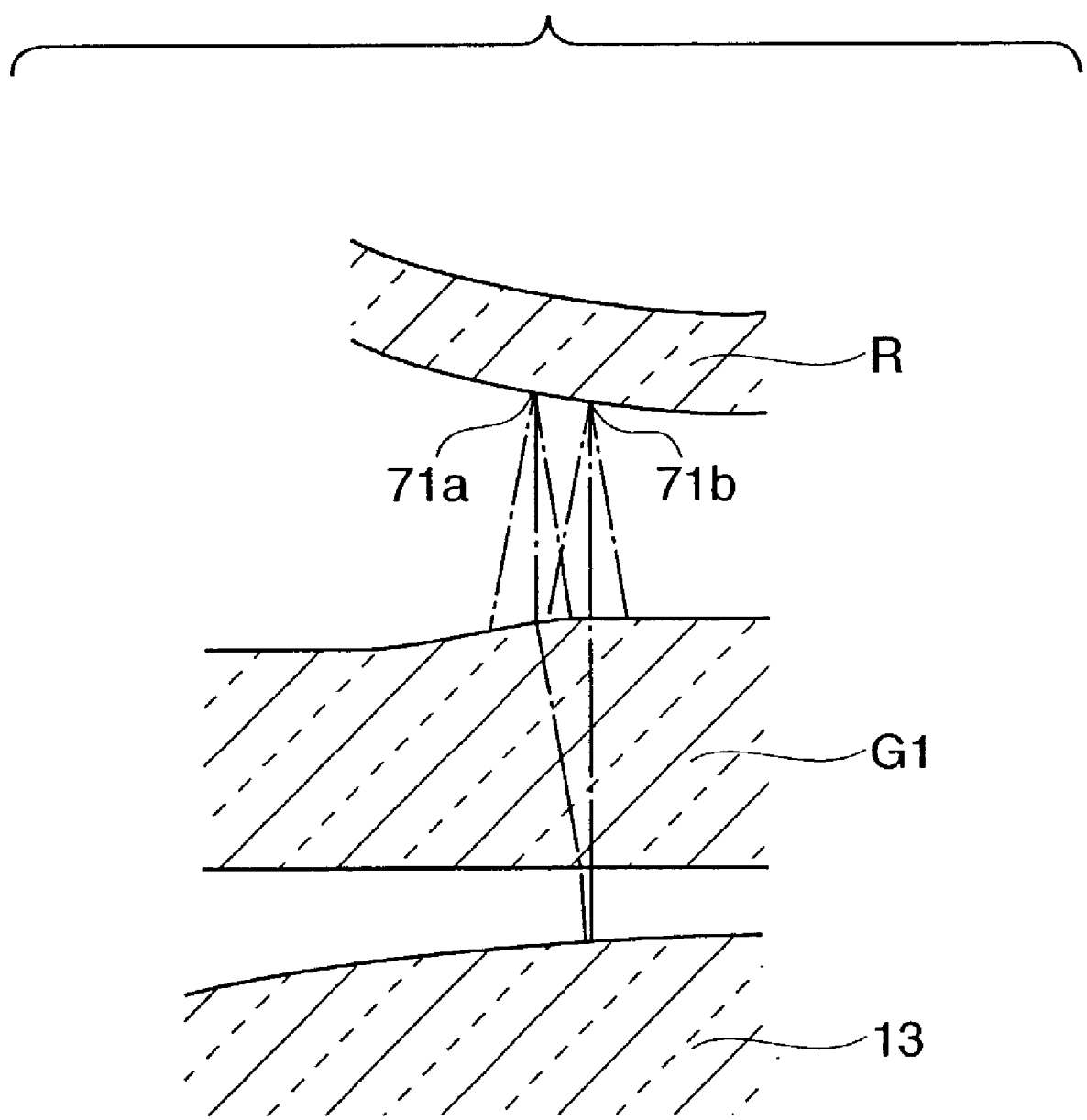
FIG. 9 is a view showing a comparison with the location of the optical element in FIG. 8.

The advantage of the arrangement of the optical element G1 in the first embodiment will be described with reference to FIGS. 8 and 9. The difference shown in FIGS. 8 and 9 is the arrangement of the optical element G1 with respect to the reticle R. In FIG. 8, the optical element G1 is arranged closer to the reticle R. In FIG. 9, the optical element G1 is arranged farther from the reticle R than in FIG. 8. A more preferable arrangement is the one shown in FIG. 8. The reason will be explained below.

Patterns 71*a* and 71*b* are formed on the reticle R, and exemplify patterns arranged close to each other. The imaging beams of the patterns 71*a* and 71*b* illuminated by an illumination optical system (2 to 8 in FIG. 1: not shown) form images on a wafer (W in FIG. 1: not shown) via the optical element G1 and projection optical system 13. FIGS. 2 to 5 show only the principal ray of the imaging beam from each pattern, but an actual imaging beam is a beam corresponding to the NA of the projection optical system 13. In FIG. 8, the imaging beams of the patterns 71*a* and 71*b* are independent on the surface of the optical element G1. In FIG. 9, the imaging beams of the patterns 71*a* and 71*b* overlap each other on the surface of the optical element G1. To correct the misalignments of the patterns 71*a* and 71*b* by the optical element G1 in the example shown in FIG. 9, the imaging beam of the pattern 71*a* and that of the pattern 71*b* must be corrected with corresponding misalignment correction amounts. At the overlapping portion of the two imaging beams, only the same misalignment correction can be done for the two imaging beams. In other words, the two imaging beams cannot be optimally corrected at the overlapping portion of the two imaging beams.

From this, the optical element G1 is desirably arranged at a position close to the reticle R as much as possible so as to prevent overlapping of imaging beams emerging from two positions on the reticle R. In the first embodiment, the optical element G1 is arranged at the movable portion (i.e., a portion which moves together with the reticle R) of the reticle stage RST. This realizes higher-precision correction than a case wherein the optical element G1 is arranged apart from the movable portion of the reticle stage RST (i.e., apart from the reticle R).

[Second Embodiment]

Figure 10:
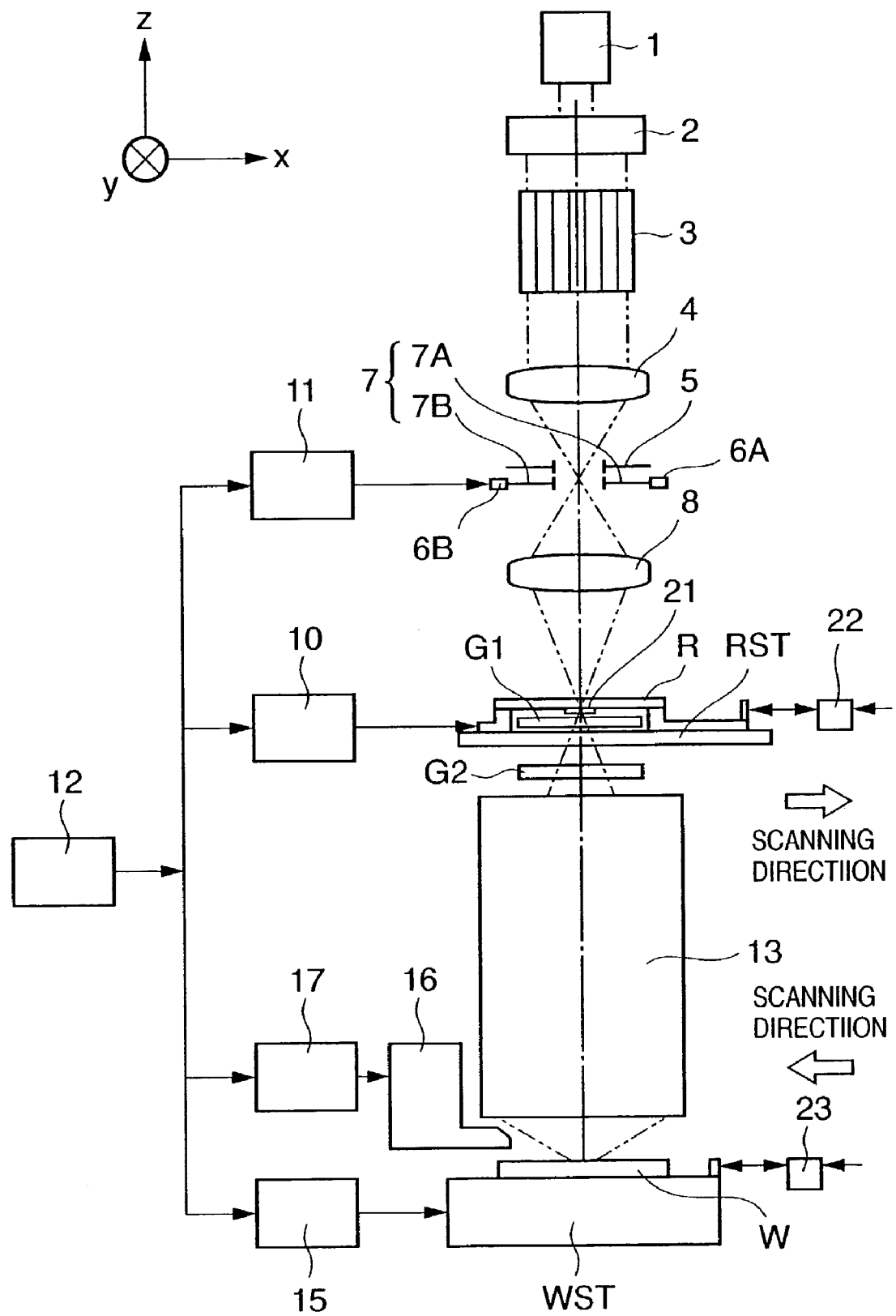
FIG. 10 is a view showing the schematic arrangement of a scanning exposure apparatus according to the second embodiment of the present invention.

FIG. 10 is a view showing the schematic arrangement of a scanning exposure apparatus according to the second embodiment of the present invention. The second embodiment of the present invention shown in FIG. 10 is different from the first embodiment shown in FIG. 1 in that a correction optical element G2 for correcting image distortion of a pattern image projected onto a wafer W is interposed between a reticle stage RST and a projection optical system 13. The optical element G2 may be arranged not between reticle stage RST and the projection optical system 13, but within the projection optical system 13 or between the projection optical system 13 and a wafer stage WST. Alternatively, optical elements G2 may be arranged at two or more portions, i.e., between the reticle stage RST and the projection optical system 13, within the projection optical system 13, and between the projection optical system 13 and the wafer stage WST.

The second embodiment adopts a correction optical element G1 for optically correcting deformation of the reticle R and the correction optical element G2 for correcting aberration (particularly distortion) of the projection optical system 13. This embodiment can separately correct image distortion on the wafer W caused by deformation of the reticle R and image distortion on the wafer W caused by the characteristic of the projection optical system 13. Accordingly, works for correcting image distortions respectively caused by the reticle stage RST and projection optical system 13 can be independently executed, shortening the exposure apparatus manufacturing time.

The surface shape of the correction optical element G2 is determined, polished, and processed on the basis of the measurement result of measuring the image distortion characteristic of only the projection optical system 13 so as to minimize image distortion on the wafer W.

As the image distortion characteristic measurement method, it is preferable to prepare and to use a test apparatus, similar to the method described in the first embodiment. More specifically, a test apparatus constituted by the reticle stage RST, illumination optical system, and wafer stage WST, which have undergone predetermined distortion adjustment, exposes a wafer to a reticle pattern, measures the exposure result, and obtains an image distortion amount.

Image distortion correction of the projection optical system 13 by the optical element G2 can employ, e.g., the correction method disclosed in Japanese Patent Laid-Open No. 1-31652.

Also, in the use of a reticle stage and a projection optical system whose image distortion characteristics are individually corrected in advance, dynamic distortion generated in scanning exposure can be adjusted by the optical element G1 or G2.

Note that the first and second embodiments have not described the optical arrangement of the projection optical system 13. The present invention can be practiced by a refracting, reflecting, or reflecting/refracting optical system.

[Device Manufacturing Method]

Figure 11:
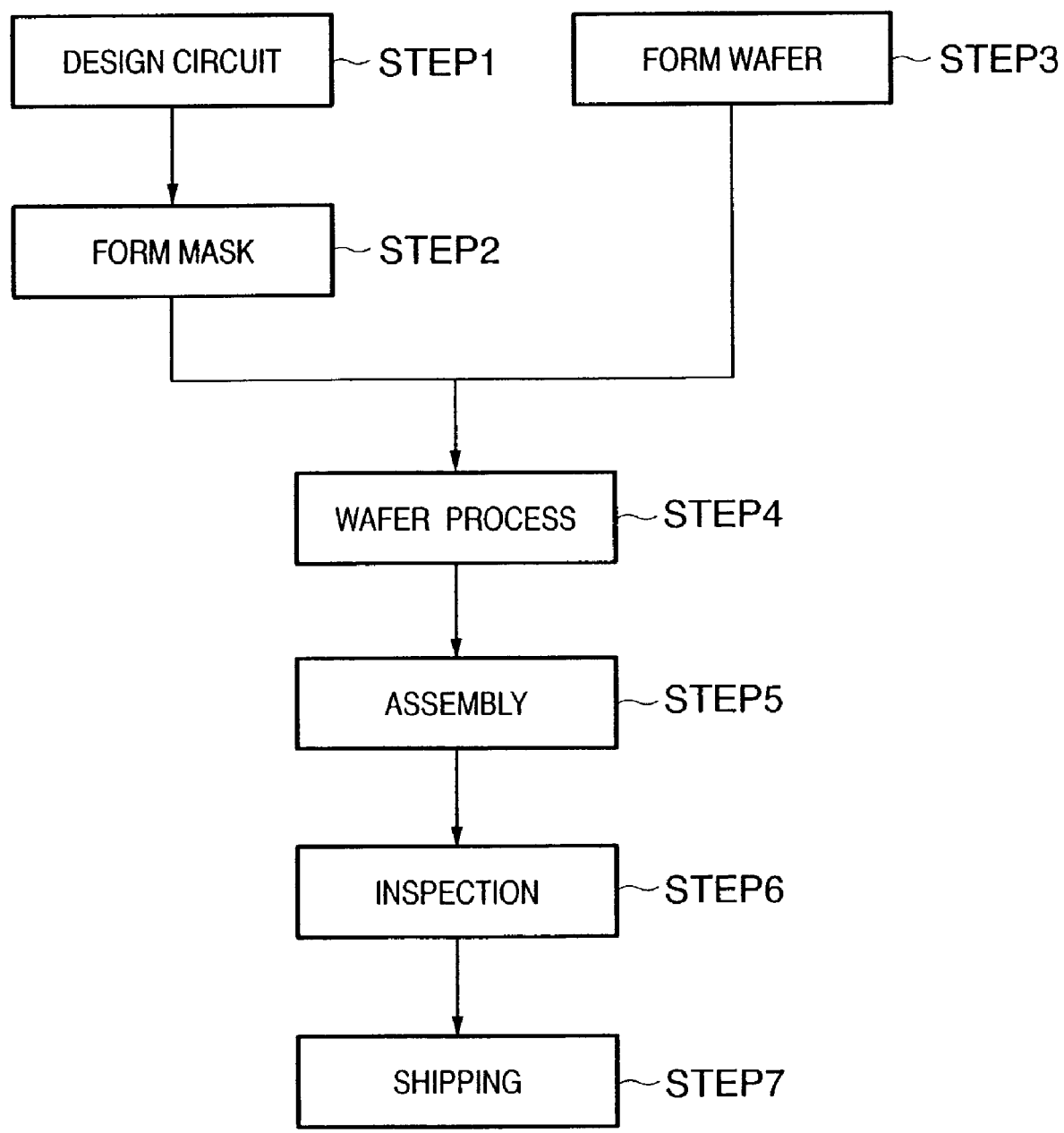
FIG. 11 is a flow chart showing the flow of the whole manufacturing process of a semiconductor device.

A device manufacturing process using the above-described exposure apparatus will be explained. FIG. 11 shows the flow of the whole manufacturing process of a semiconductor device. In step 1 (circuit design), a semiconductor device circuit is designed. In step 2 (mask formation), a mask is formed based on the designed circuit pattern. In step 3 (wafer formation), a wafer is formed using a material such as silicon. In step 4 (wafer process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 12:
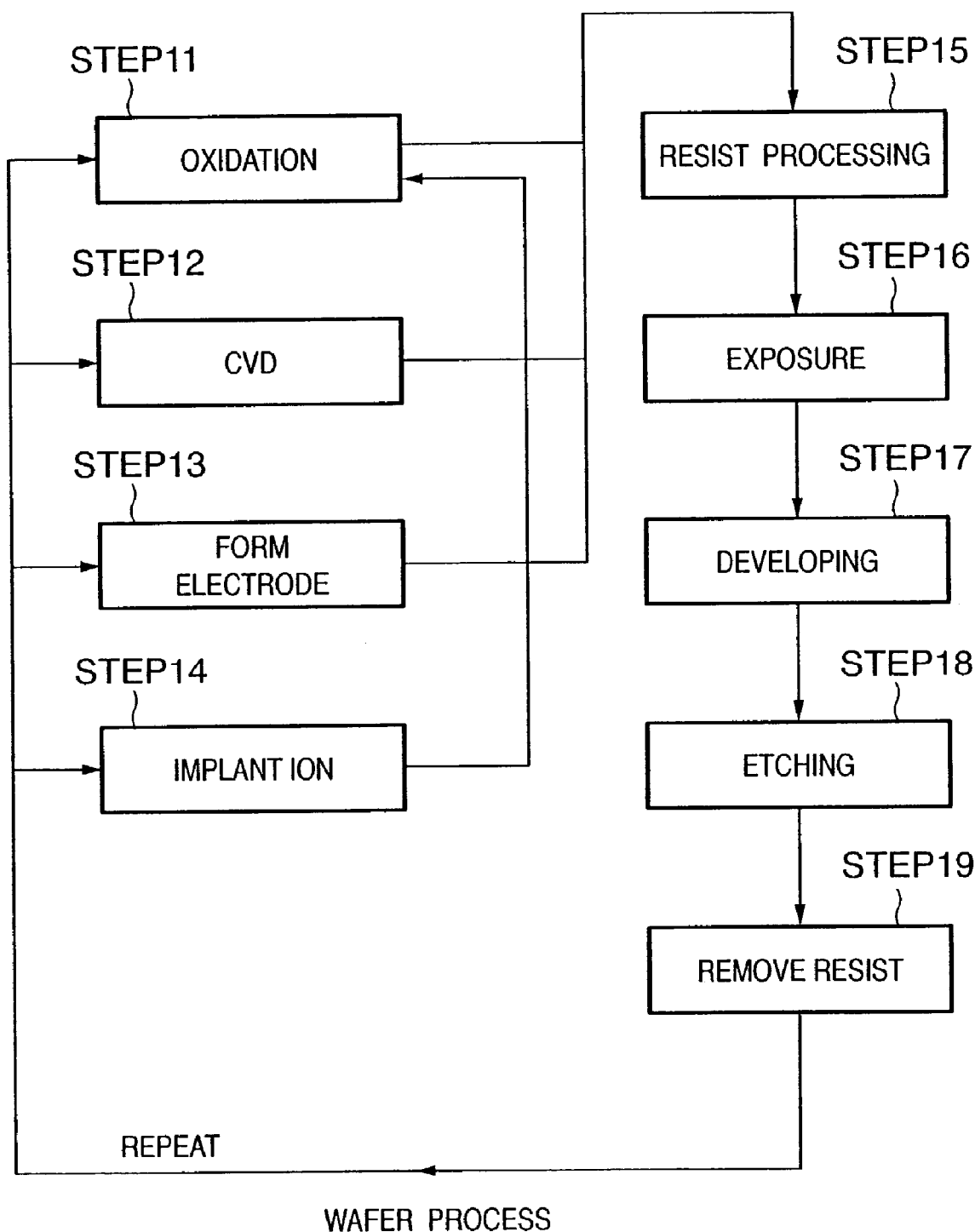
FIG. 12 is a flow chart showing the detailed flow of a wafer process.

FIG. 12 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers a circuit pattern onto the wafer. In step 17 (developing), the exposed wafer is developed. In step 18 (etching), the resist is etched, except for the developed resist image. In step 19 (resist removal), an unnecessary resist after etching is removed. These steps are repeated to form multiple circuit patterns on the wafer.

According to the preferred embodiments of the present invention, the influence of the surface shape of the reticle pattern surface as one of distortion generation factors can be corrected. In particular, distortion caused by the flatness error of the reticle chucking surface as a reticle stage manufacturing error can be corrected separately from distortion caused by the projection optical system. The exposure precision in the scanning exposure apparatus can be greatly improved.

According to the preferred embodiments of the present invention, distortion adjustment which can only be performed in the apparatus main body in the prior art can be executed individually for the reticle stage and projection optical system in advance. This can greatly shorten the apparatus manufacturing time.

According to the preferred embodiments of the present invention, individual distortion adjustment for the reticle stage and projection optical system in advance can realize a very short distortion adjustment time even if the reticle stage or projection optical system needs to be replaced after the operation of the exposure apparatus.

Moreover, the correction optical element is arranged closer to the reticle than the conventional arrangement of the correction optical element. For example, the correction optical element is assembled in the reticle stage so as to move the correction optical element together with the reticle. This can greatly increase the exposure precision in the scanning exposure apparatus.

The optical element which is held by the reticle stage and moved together with the reticle can be utilized not only for the above-described purpose but also for another purpose.

The present invention can correct, at a high precision, the defect (e.g., distortion) of a pattern projected onto a substrate that is caused by, e.g., the surface shape of a master on a master stage, and/or can facilitate correction.

As many apparently widely different embodiments of the present invention can be made without departing from the spirit and scope thereof, it is to be understood that the invention is not limited to the specific embodiments thereof except as defined in the claims.

What is claimed is:

1. A scanning exposure apparatus for scan-exposing a substrate to light through a mask, while the substrate and the mask are moved in scanning directions, said apparatus comprising:
   a mask stage configured to hold the mask and to move in the scanning direction;
   a projection optical system configured to project a pattern of the mask to form an image of the pattern on the substrate; and
   a first optical element, held by said mask stage, said first optical element having been processed so as to reduce shift of an image to be formed on the substrate with projection of the pattern of the mask, based on a shape of a reference mask held by said mask stage, the shift being caused by a shape of the mask in a state that the mask is held by said mask stage.

2. An apparatus according to claim 1, further comprising a second optical element, different from said first optical element, configured to suppress aberration of said projection optical system.

3. A method of manufacturing a device, said method comprising steps of:
   exposing a substrate to an image of a pattern of a mask using a scanning exposure apparatus as defined in claim 1;
   developing the exposed substrate; and
   processing the developed substrate to manufacture the device.

4. An apparatus according to claim 1, wherein the reference mask is a mask which is processed into a reference thickness and flatness in advance and measured for the thickness and the flatness.

5. An apparatus according to claim 1, wherein the first optical element is an optical element which has been processed based on a distortion amount of an image formed on the substrate with projection of a pattern of the reference mask held by said mask stage, the distortion amount being obtained in a state that said mask stage is incorporated in a test apparatus in which aberrations are adjusted.

6. A method of manufacturing a scanning exposure apparatus, the apparatus having a mask stage configured to hold a mask and to move in a scanning direction, and a projection optical system configured to project a pattern of the mask to form an image of the pattern on a substrate, said method comprising steps of:
   causing the mask stage to hold a reference mask;
   measuring a surface shape of the reference mask held by the mask stage;
   processing a first optical element, so as to reduce shift of an image to be formed on the substrate with the projection of the pattern of the mask, based on a measurement in said measuring step, the shift being caused by a shape of the mask in a state that the mask is held by the mask stage; and
   assembling the processed first optical element into the mask stage.

7. A method according to claim 6, further comprising a step of assembling the mask stage into the scanning exposure apparatus after assembling the processed first optical element into the mask stage.

8. A method according to claim 6, wherein the reference mask is a mask which is processed into a reference thickness and flatness in advance and measured for the thickness and the flatness.

9. A method of manufacturing a scanning exposure apparatus, the apparatus having a mask stage configured to hold a mask and to move in a scanning direction, and a projection optical system configured to project a pattern of the mask to form an image of the pattern on a substrate, said method comprising:
   a mask stage assembly step of processing a first optical element, so as to reduce shift of an image to be formed on the substrate with projection of the pattern of the mask, based on a shape of a reference mask held by said mask stage, then assembling the processed first optical element into the mask stage, and assembling the mask stage into the scanning exposure apparatus, the shift being caused by a shape of the mask in a state that the mask is held by said stage; and
   a projection optical system assembly step of processing a second optical element, so as to suppress aberration of the projection optical system, and then assembling the projection optical system into the scanning exposure apparatus together with the processed second optical element.

10. A method according to claim 9, wherein the reference mask is a mask which is processed into a reference thickness and flatness in advance and measured for the thickness and the flatness.

11. A method of manufacturing a scanning exposure apparatus, the apparatus having a mask stage configured to hold a mask and to move in a scanning direction, and a projection optical system configured to project a pattern of the mask to form an image of the pattern on a substrate, said method comprising steps of:
   causing the mask stage to hold a reference mask, the mask stage being incorporated in a test apparatus in which aberrations are adjusted;
   measuring distortion of an image of the reference mask held by the mask stage, the image being formed by the test apparatus;
   processing an optical element so as to reduce shift of an image to be formed on the substrate with projection of the pattern of the mask, based on a measurement result in said measuring step, the shift being caused by a shape of the mask in a state that the mask is held by said mask stage; and
   assembling the processed optical element into the mask stage.

12. A method according to claim 11, wherein the reference mask is a mask which is processed into a reference thickness and flatness in advance and measured for the thickness and the flatness.

* * * * *